United States Patent [19]

Rollett

[11] 4,074,215

[45] Feb. 14, 1978

[54] STABLE GYRATOR NETWORK FOR SIMULARITY INDUCTANCE

[75] Inventor: John Mortimer Rollett, London, England

[73] Assignee: Post Office, London, England

[21] Appl. No.: 729,716

[22] Filed: Oct. 5, 1976

[30] Foreign Application Priority Data

Oct. 7, 1975 United Kingdom ............ 40985/75

[51] Int. Cl.² ...................... H03H 7/44; H03H 11/00
[52] U.S. Cl. .................................. 333/80 R; 330/84
[58] Field of Search ............ 333/80 R, 80 T; 330/84; 307/229

[56] References Cited

U.S. PATENT DOCUMENTS 3,566,298  2/1971  Stevens ................................. 330/84
3,573,647  4/1971  Antoniou ........................ 333/80 R X Primary Examiner—Paul L. Gensler
Attorney, Agent, or Firm—Hall & Houghton

[57] ABSTRACT

An unconditionally stable gyrator circuit includes two interconnected d.c. differential amplifiers. The terminals of an input port are respectively connected to the non-inverting inputs of the amplifiers, that to the second amplifier being connected through a resistor. The inverting input of the first amplifier is connected to the non-inverting input of the second, the output of the first amplifier is connected through a resistor to the inverting input of the second amplifier and the output of the second amplifier is connected through a resistor to the non-inverting input of the first amplifier. Two alternative output ports are provided between the output of the first amplifier and the non-inverting input of the second, and between the output of the second amplifier and its inverting input. The output port which is not used has a resistive impedance connected across it.

6 Claims, 1 Drawing Figure

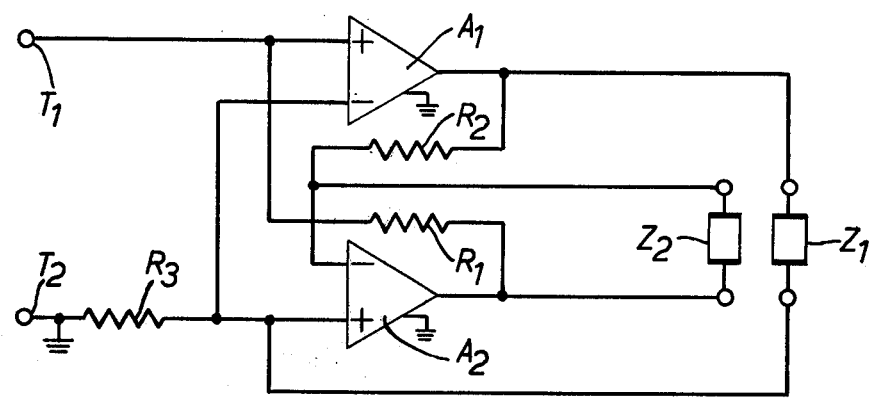

STABLE GYRATOR NETWORK FOR SIMULARITY INDUCTANCE

This invention relates to electrical impedance networks of the type which are capable of simulating inductances without the use of physical inductors.

With the introduction of micro-miniature circuitry it has become necessary to be able to simulate inductance by means of a circuit arrangement which does not use an inductor. For certain networks such as, for example, resonant circuits, inductance is required but with the use of transistors and integrated or thin film circuit devices by far the largest proportion of the bulk of circuit arrangement is occupied by the inductor. To overcome this difficulty it is known to provide a gyrator, which has the property of producing at one port an impedance which is proportional to the inverse of the impedance connected across another port, so that if a capacitor is connected across the other port the device, together with the capacitor, when viewed from the one port behaves like an inductor. Some such devices have been conditionally stable so that difficulty is experienced when the device is switched on. The term "conditionally stable" means that the device when operating is stable but during the initial period following the switching on as the gains of the amplifiers increase from zero to their working value, so the device passes through an unstable condition which causes the amplifiers to saturate, thereby limiting their effective gains and preventing the device from reaching the stable operating condition.

It is an object of the present invention to provide a network having the properties of a gyrator which is relatively simple and unconditionally stable.

According to the present invention there is provided an electrical impedance network including first and second differential d.c. amplifiers each having an inverting input and a non-inverting input and an output, an input port comprising a first input terminal and a second input terminal, a first alternative load output port and a second alternative load output port, the non-inverting input of the first amplifier being connected directly to the first input terminal and, by way of a first resistive impedance, to the output of the second amplifier, the inverting input of the second amplifier being connected by way of a second resistive impedance to the output of the first amplifier, the non-inverting input of the second amplifier being connected by way of a third resistive impedance to the second input terminal, the first alternative load output port being formed between the non-inverting input of the second amplifier and the output of the first amplifier, and the second alternative load output port being formed between the inverting input terminal of the second output amplifier and the output terminal of the second amplifier, and in which the non-inverting input terminal of the second amplifier is directly connected to the inverting input of the first amplifier so that, with a resistive impedance connected in one of said alternative load output ports the network presents at its input port an impedance which is proportional to the inverse of an output load connected across the other alternative load output port.

In order that the invention may be fully understood and readily carried into effect it will now be described with reference to the single FIGURE of the accompanying drawing, which is a diagram of a network according to the invention.

Referring to the drawing, it will be seen that input terminals T1 and T2 respectively are connected to the non-inverting input terminals of amplifiers A1 and A2. Both of the amplifiers A1 and A2 are differential d.c. amplifiers, preferably of relatively high gain, say 1,000 or more. The input terminal T2 may be connected to a low impedance source of reference potential, such as earth, as shown. Whereas the connection of the input terminal T1 to the amplifier A1 is direct, that of the input terminal T2 to the amplifier A2 is through a resistor R3. The output of the amplifier A1 is connected through a resistor R2 to the inverting input of the amplifier A2 and through an impedance Z1 to the non-inverting input of the amplifier A2. The output of the amplifier A2 is connected through a resistor R1 to the non-inverting input of the amplifier A1 and through an impedance Z2 to its own inverting input. The inverting input of the amplifier A1 is connected directly to the non-inverting input of the amplifier A2.

The input terminals T1 and T2 may be regarded as constituting an input port and the terminals of the impedances Z1 and Z2 respectively may constitute first and second output ports.

The amplifiers A1 and A2 may be operational amplifiers and may be formed by integrated circuits. Suitable integrated circuit types are:
Fairchild
$\mu$A 702 C
$\mu$A 709 C
$\mu$A 741
and Motorola dual integrated operational amplifier MC 1435.

Alternatively, the amplifiers A1 and A2 could be provided on a single integrated circuit together with the resistors R1, R2 and R3, although no such circuit is commercially available at present.

The network shown in the drawing will operate as a gyrator if the terminals T1 and T2 are taken as an input port, the terminals of one of the impedances Z1 and Z2 are taken as an output port, and the other of the impedances Z1 and Z2 is a pure resistance. If the impedance (Z1 or Z2) connected to the output port is a mica capacitor, for example, then the impedance measured across the terminals T1 and T2 corresponds to that of an inductance having a Q factor in excess of 2,000.

Usually the gains of both amplifiers A1 and A2 are chosen to be very large, and although the resistors R1, R2 and R3 and the one of the impedances Z1 and Z2 which is selected to be a resistance may have any value for the operation of the network as a gyrator they are usually chosen to be of equal value. The closeness with which the network simulates an ideal gyrator is dependent on the gains of the amplifiers. Useful results can be obtained with gains in excess of about 50, but more usefully, the gain should be greater than 1,000 and preferably several tens of thousands. The pass bands of the amplifiers must include the operating frequencies of the network.

I claim:

1. An electrical impedance network including first and second differential d.c. amplifiers each having an inverting input and a non-inverting input and an output, an input port comprising a first input terminal and a second input terminal, a first alternative load output port and a second alternative load output port, the non-inverting input of the first amplifier being connected directly to the first input terminal and, by way of a first resistive impedance, to the output of the second amplifier, the inverting input of the second amplifier being connected by way of a second resistive impedance to the output of the first amplifier, the non-inverting input of the second amplifier being connected by way of a third resistive impedance to the second input terminal, the first alternative load output port being formed between the non-inverting input of the second amplifier and the output of the first amplifier, and the second alternative load output port being formed between the inverting input terminal of the second output amplifier and the output terminal of the second amplifier, and in which the non-inverting input terminal of the second amplifier is directly connected to the inverting input of the first amplifier so that, with a resistive impedance connected in one of said alternative load output ports the network presents at its input port an impedance which is proportional to the inverse of an output load connected across the other alternative load output port.

2. A network according to claim 1 in which the first and second amplifiers are integrated circuit amplifiers.

3. A network according to claim 1 wherein the first, second and third resistive impedances are of equal value, and there is connected across one of said alternative load output ports a fourth resistive impedance of the same value, the other alternative load output port forming the output of the network.

4. A network according to claim 3 wherein the gains of the amplifiers are greater than 50.

5. A network according to claim 4 wherein the gains of the amplifiers are greater than 1,000.

6. A network according to claim 5 wherein the gains of the amplifiers are of the order of several tens of thousands.

* * * * *